US006326809B1

(12) United States Patent
Gambles et al.

(10) Patent No.: US 6,326,809 B1
(45) Date of Patent: Dec. 4, 2001

(54) APPARATUS FOR AND METHOD OF ELIMINATING SINGLE EVENT UPSETS IN COMBINATIONAL LOGIC

(75) Inventors: Jody W. Gambles; Kenneth J. Hass, both of Albuquerque, NM (US); Kelly B. Cameron, Irvine, CA (US)

(73) Assignee: University of New Mexico, Albequerque, NM (US)

( * ) Notice: Subject to any disclaimer, the term of this patent is extended or adjusted under 35 U.S.C. 154(b) by 0 days.

(21) Appl. No.: 09/407,232

(22) Filed: Sep. 27, 1999

(51) Int. Cl.$^7$ ............................ G11C 11/00; H01L 23/552

(52) U.S. Cl. ........................ 326/46; 365/154; 257/921; 327/215; 327/57

(58) Field of Search .............................. 365/189.08, 154; 257/921; 326/38, 46; 327/166, 215, 57, 55, 176

(56) References Cited

U.S. PATENT DOCUMENTS

| | | | |
|---|---|---|---|
| 5,111,429 | 5/1992 | Whitaker | 365/156 |
| 5,374,894 | * 12/1994 | Fong | 327/14 |
| 5,406,513 | 4/1995 | Canaris et al. | 365/181 |
| 5,418,473 | 5/1995 | Canaris | 326/27 |
| 5,436,865 | * 7/1995 | Kitazawa | 365/194 |
| 5,870,332 | * 2/1999 | Lahey et al. | 365/156 |
| 5,875,152 | * 2/1999 | Liu et al. | 365/233.5 |
| 5,905,290 | * 5/1999 | Houston | 257/380 |

OTHER PUBLICATIONS

"A Gate–Level Simulation Environment for Alpha–Particle–Induced Transient Faults" Hungse Cha, Elizabeth Rudnick, James Patel, Ravishaknar Iyer and Gwan Choi, IEEE Transactions on Computers, vol. 45, No. 11, pp. 1248–1256, Nov. 1996.

"Upset Due To A Single Particle Caused Propagated Transient In A Bulk CMOS Microprocessor" J.F. Leavy, L.F. Hoffmann, R.W. Shovan, M.T. Johnson, IEEE Transactions on Nuclear Science, vol. 38, No. 6, pp. 1493–1499, Dec. 1991.

"Laser Confirmation of SEU Experiments in GaAs MESFET Combinational Logic" R, Schneiderwind, D. Kening, S. Buchner, K. Kang and T.R. Weatherford, IEEE Transactions on Nuclear Science, vol. 39, No. 6, pp. 1665–1670, Dec. 1992.

(List continued on next page.)

*Primary Examiner*—Michael Tokar
*Assistant Examiner*—Daniel D. Chang
(74) *Attorney, Agent, or Firm*—Haverstock & Owens LLP

(57) ABSTRACT

An apparatus for and method of eliminating single event upsets (or SEU) in combinational logic are used to prevent error propagation as a result of cosmic particle strikes to the combinational logic. The apparatus preferably includes a combinational logic block electrically coupled to a delay element, a latch and an output buffer. In operation, a signal from the combinational logic is electrically coupled to a first input of the latch. In addition, the signal is routed through the delay element to produce a delayed signal. The delayed signal is routed to a second input of the latch. The latch used in the apparatus for preventing SEU preferably includes latch outputs and a feature that the latch outputs will not change state unless both latch inputs are correct. For example, the latch outputs may not change state unless both latch inputs have the same logical state. When a cosmic particle strikes the combinational logic, a transient disturbance with a predetermined length may appear in the signal. However, a function of the delay element is to preferably provide a time delay greater than the length of the transient disturbance. Therefore, the transient disturbance will not reach both latch inputs simultaneously. As a result, the latch outputs will not permanently change state in error due to the transient disturbance. In addition, the output buffer preferably combines the latch outputs in such a way that the correct state is preserved at all times. Thus, combinational logic with protection from SEU is provided.

31 Claims, 5 Drawing Sheets

OTHER PUBLICATIONS

"Single Event Upset Cross Sections At Various Data Rates" R.A. Reed, M.A. Carts, P.W. Marshall, C.J. Marshall, S. Buchner, M. La Macchia, B. Mathes and D. McMorrow, IEEE Transactions on Nuclear Science, vol. 43, No. 6, pp. 2862–2867, Dec. 1996.

"Comparison of Error Rates in Combinational and Sequential Logic" S. Buchner, M. Baze, D. Brown, D. McMorrow and J. Melinger, IEEE Transactions on Nuclear Science, vol. 44, No. 6, pp. 2209–2216, Dec. 1997.

"Impact of Technology Trends on SEU in CMOS SRAMs" P.E. Dodd, F.W. Sexton, M.R. Shaneyfelt, B.L. Draper, A.J. Farino and R.S. Flores, IEEE Transactions on Nuclear Science, vol. 43, No. 6, pp. 2797–2804, Dec. 1996.

"SEU Hardened Memory Cells For A CCSDS Reed Solomon Encoder" Sterling Whitaker, John Canaris and Kathy Liu, IEEE Transactions on Nuclear Science, vol. 38, No. 6, pp. 1471–1477, Dec. 1991.

"Low Power SEU Immune CMOS Memory Circuits" M. Norley Liu and Sterling Whitaker, IEEE Transactions on Nuclear Sceince, vol. 39, No. 6, pp. 1679–1684, Dec. 1992.

"Circuit Techniques for the Radiation Environment of Space" John Canaris and Sterling Whitaker, IEEE 1995 Customer Integrated Circuits Conference, pp. 77–80, 1995.

"RAD–Tolerant Flight VLSI From Commercial Foundries" Jody Gambles and Gary Maki, Proceedings of the 39th Midwest Symposium on Circuits and Systems, pp. 1227–1230, Aug. 18–21, 1996.

"SEU Simulation and Testing of Resistor–Hardened D–Latches in the SA3300 Microprocessor" Sexton, Corbett, Treece, Hass, Hughes, Axness, Hash, Shaneyfelt and Wunsch, IEEE Transactions on Nuclear Science, vol. 38, No. 6, pp. 1521–1528, Dec. 1991.

"Soft–Error Filtering: A Solution to the Reliability Problem of Future VLSI Digital Circuits" Yvon Savaria, Nicholas Rumin, Jeremiah Hayes and Viond Agarwal, Proceeding of the IEEE, vol. 74, No. 5, pp. 669–683, 1986.

"Attenuation of Single Event Induced Pulses in CMOS Combination Logic" M.P. Baze and S.P. Buchner, IEEE Transaction on Nuclear Science, vol. 44, No. 6, pp. 2217–2222, Dec. 1997.

"On Latching Probability of Particle Induced Transients in Combinational Networks" Peter Liden, Peter Dahlgren, Rolf Johansson and Johan Karlsson, IEEE Computer Society Press, 24th International Symposium on Fault–Tolerant Computing, pp. 340–349, Jun. 15–17, 1994.

"Single Event Transients in Deep Submicron CMOS" K. Joe Hass and Jody W. Gambles, 42nd Midwest Symposium on Circuits and Systems, Aug. 1999.

"Mitigating Single Event Upsets From Combinational Logic" K. Joe Hass, Jody Gambles, Bill Walker and Mike Zampaglione, 7th NASA Symposium on VLSI Design, pp. 4.1.1–4.1.10, 1998.

S.M. Kang and D. Chu, "CMOS Circuit Design for Prevention of Single Event Upset", pp. 118158–118161, 1986 Proc. of 1986 International Conf. on Computer Design, Port Chester, NY.

* cited by examiner

APPARATUS FOR AND METHOD OF ELIMINATING SINGLE EVENT UPSETS IN COMBINATIONAL LOGIC

GOVERNMENT LICENSE RIGHTS

The U.S. Government has a paid-up license in this invention and the right in limited circumstances to require the patent owner to license to others on reasonable terms as provided for by the terms of Federal Grant No. NAG5-3568 awarded by NASA.

FIELD OF THE INVENTION

The present invention relates to the field of single event upset elimination within combinational logic. More specifically, this invention relates to circuits that use a delay element, a latch and an output buffer to prevent error propagation caused by cosmic ray strikes to combinational logic. Furthermore, the present invention relates to the field of designing circuits that are physically smaller and consume less power than circuits using conventional methods to provide single event upset immunity.

BACKGROUND OF THE INVENTION

Cosmic rays, also known as radiation, cosmic particles, ionized particles or alpha particles, are actually electrons, protons, heavy ions or atomic nuclei that travel through space with very high energy. Cosmic rays can penetrate the metal skin of a spacecraft and pass through electronic devices inside the spacecraft. When a cosmic particle penetrates an electronic circuit element, a small amount of electric charge may be deposited in the circuit element. In many integrated circuits, charge represents a logic state. If a radiation hit occurs within an integrated circuit, this deposited charge can change the logic state of the integrated circuit at the location where the radiation hit occurred. This phenomenon has been known to cause errors in electronic memories of equipment such as artificial satellites.

The occurrence of an error within electronic circuitry as a result of a cosmic particle strike is called a single event upset or SEU. An SEU can occur in an integrated circuit when radiation hits a susceptible point in the integrated circuit. Many integrated circuits include latches and flip flop elements. A cosmic ray strike to a latch or flip flop can result in the deposit of a transient charge in the latch or flip flop and cause the latch or flip flop to change state. The state of the latch or flip flop is used as a form of stored information. When a transient phenomenon causes a latch or a flip flop to change state, the result can be an error in the stored information. Depending upon the circuit, it is possible that the error is not corrected. Although only a temporary disturbance occurs at the location of the cosmic particle strike, the error can be made permanent through feedback. In addition, trends within integrated circuits to require increasingly smaller features, have produced smaller latches and flip flops. As a result, the relative size and effect of cosmic particles are increased with respect to smaller latches and flip flop elements. Therefore, latches and flip flop elements are more vulnerable to cosmic particle hits due to the smaller circuit geometries of present day integrated circuits. As a result, SEU is easily observed in latches, flip flops and integrated circuits.

It has been determined that an SEU can also occur when a cosmic ray strikes a combinational logic block. Combinational logic is a term used to describe logic circuits that are used to create a data bit, or result, that will be stored in a latch or a flip flop. The process of storing data in a latch or a flip flop is controlled by a clock signal. Proper functioning of any conventional latch or flip flop requires an input signal that remains stable and in a correct state for a certain period of time before and after a critical transition period, or edge of the clock signal. If a voltage disturbance caused by a cosmic particle strike to the combinational logic, also called a Single Event Transient, propagates to the input signal of the latch or flip flop during the critical transition period, then the latch or flip flop will store an incorrect data value and an SEU will occur.

Performance trends in the development of integrated circuits have lead to circuits with increasingly faster clock frequencies. Over a given time period, an increased clock frequency results in an increased number of critical transition periods. The increased number of critical transition periods per unit time provides increased opportunities for a cosmic ray induced voltage disturbance to cause a Single Event Upset by arriving at the latch or flip flop input during the edge of the clock signal. As a result of more frequent critical transition periods, modern high speed integrated circuits have an increased risk of SEU due to the increased likelihood that a Single Event Transient will arrive at the latch or flip flop during the critical transition period surrounding the clock edge.

FIG. 1 illustrates an example of a prior art logic circuit 10, including a combinational logic block 110 and a latch 13. The combinational logic block 110 produces a data signal 12 representing some binary data value, either a logic '0' or a logic '1.' The logic value of the data signal 12 is provided to a latch data input terminal D for storage in the latch 13. The prior art logic circuit 10 uses a clock signal 132 and an inverted clock signal 134, where the inverted clock signal 134 is the logical complement of the clock signal 132. In addition, the clock signal 132 and the inverted clock signal 134 change state, or assert and dessert, simultaneously. For example, the clock signals are asserted when the clock signal 132 rises from a logical '0' to a logical '1' and the inverted clock signal 134 falls from a logical '1' to a logical '0'. In operation, when the clock signal 132 and the inverted clock signal 134 are asserted the binary value of the data signal 12 will be provided as an output signal 14 on an output terminal Q. When the clock signals 132 and 134 are deasserted, the latch 13 will store and maintain the value of the data signal 12 as the output signal 14 until the clock signals 132 and 134 are again asserted. The period of time in which the clock signal 132 and the inverted clock signal 134 change state is also known as the clock signal transition.

FIG. 3 illustrates the timing relationship for the prior art logic circuit 10 under normal conditions when no cosmic ray has struck the combinational logic block 110. The reference numerals are used to identify these waveforms as the corresponding signal lines in FIG. 1. As illustrated, the data signal 12 from the combinational logic block 110 changes from a logic '1' to a logic '0' at some time well before the clock signal 132 and the inverted clock signal 134 are deasserted. When the clock signal transition occurs, the data signal 12 is in a stable logic '0' state. The binary value or state of the data signal 12 is stored in the latch 13 and is maintained as the output signal 14 at the output terminal Q when the clock signals 132 and 134 are deasserted. The '0' state is maintained on the output signal 14 even though the data signal 12 changes to a logic '1' state after the clock signal 132 and the inverted clock signal 134 have deasserted.

FIG. 4 shows the timing relationship for the prior art logic circuit 10 during a single event upset or SEU. The timing diagram of FIG. 4 includes a period of time when a cosmic ray strikes the combinational logic block 110 during the clock signal transition. The particle hit results in a transient disturbance 20 within the data signal 12'. The transient disturbance 20 causes the binary value of the data signal 12' to temporarily and erroneously change state. In the exemplary timing diagram of FIG. 4, the data signal 12' changes from a logic '0', representing the value provided by the combinational logic block 110, to a logic '1', representing the transient disturbance 20 caused by the cosmic particle strike.

The transient disturbance 20 within the data signal 12' propagates to the input terminal D of the latch 13. The latch 13 behaves as though the transient disturbance 20 is a valid input and changes state to a logic '1' resulting in an error 22 within the output signal 14'. As a result, the output signal 14' including the error 22 does not accurately represent the value of the data signal 12' provided by the combinational logic block 110. By the time the transient disturbance 20 has passed and the data signal 12' returns to the correct logic '0' state, the clock signals 132 and 134 have deasserted, thereby preventing the latch 13 from changing state until the next clock signal transition. As a result, an SEU occurs since the latch 13 stores and the output signal 14' maintains the error 22. Therefore, the example illustrated by FIG. 4 constitutes a single event upset.

In the past, four conventional techniques have been employed to provide SEU immunity for combinational logic. In the first conventional technique, the capacitance of all signal lines can be made very large so that a charge deposited by a cosmic ray does not cause a significant voltage disturbance. This approach is impractical for all but the most trivial integrated circuits because the resulting SEU immune combinational logic circuit is physically large, making it expensive, and either consumes excessive power or is very slow.

Second, all of the circuits that comprise a combinational logic block can be designed with a high current drive capability to remove any deposited charge very quickly and minimize any resulting voltage disturbance. This technique also leads to circuits that are physically large and consume excess power, and is impractical for most integrated circuits of interest.

A third conventional technique to reduce errors caused by cosmic ray strikes in combinational logic is known as "triple modular redundancy." In this technique, a combinational logic block can be replicated three times and a majority voting circuit used to ignore the incorrect data produced by any one block that is struck by a cosmic particle. Triple modular redundancy obviously increases size and power consumption of the circuit by at least a factor of three.

The fourth approach involves the use of special logic circuits in the combinational logic block, such as those described in U.S. Pat. No. 5,418,473 issued May 23, 1995 to John Canaris. That patent, entitled SINGLE EVENT UPSET IMMUNE LOGIC FAMILY, is incorporated in its entirety herein by reference. These special logic circuits are designed to recover from cosmic ray strikes without propagating a voltage transient. The disadvantage of this technique is that the special logic circuits are significantly different from those used in conventional integrated circuit design and are not compatible with common design tools and techniques.

Therefore, a need exists for an improved method of reducing or eliminating SEU caused by cosmic particle strikes in combinational logic. The improved method needs to be compatible with standard manufacturing processes and commonly used integrated circuit design tools and techniques. Further, what is needed is a technique for providing SEU immunity to combinational logic circuits without a large increase in the physical size of the circuit, without consuming excessive power and without requiring the age of unique logic circuits in the combinational logic.

SUMMARY OF THE INVENTION

The present injunction provides an apparatus for and a method of reducing or eliminating single event upsets caused by cosmic ray strikes in combinational logic. The method of the present invention is preferably compatible with standard design tools and manufacturing process for integrated circuits. In addition, the present invention preferably eliminates error propagation and single event upsets with a minimum increase in the physical size and power consumption of the integrated circuit.

The apparatus and method of the present invention are preferably achieved by routing a signal from a combinational logic block through a delay element, a latch and an output buffer. In practice, a data signal from the combinational logic block is electrically coupled to a first latch input. The data signal is also routed through the delay element to produce a delayed signal. The delay element may either be inverting or noninverting. The delayed signal is routed to a second latch input. The latch used in the apparatus of the present invention preferably includes latch outputs and a feature that the latch outputs will not change state unless both latch inputs are in a correct state. As examples, the correct state of the latch inputs may be that both inputs are in the same logical state or that the two inputs are in opposite logical states, depending on the specific implementation of the latch. Accordingly, when the present invention includes a latch that only changes state when the first and second latch inputs are in the same logical state, a noninverting delay element is preferably used. Similarly, when an inverting delay element is used the present invention preferably includes a latch that only changes state when the first and second latch inputs are in opposite logical states. In operation, the present invention prevents an error from propagating through the latch. This is because an SEU will not occur unless a transient voltage disturbance caused by a cosmic ray strike to the combinational logic, propagates to both latch inputs simultaneously.

When a cosmic particle strikes the combinational logic, a transient disturbance with a predetermined length may appear in the signal. However, a preferred function of the delay element is to provide a time delay greater than the length of an expected transient disturbance. By delaying the signal, the transient disturbance will not reach both latch inputs simultaneously. Therefore, the latch outputs will not permanently change state in error due to the transient disturbance. However, such an event may cause a brief disturbance on the latch outputs. As a result, the output buffer is preferably designed to prevent the brief disturbance on the latch outputs from being observed as valid information stored in the latch. Furthermore, the output buffer preferably buffers and combines the latch outputs in such a way that the correct data is preserved at all times. Preferably, the output buffer also prevents propagation of a transient disturbance caused by a cosmic ray strike to the latch itself.

The method of the present invention allows the use of conventional design practices for creating the combinational logic block because the delay element, the latch, and the output buffer are designed for use with conventional combinational logic. An additional result is that the combinational logic block in the present invention is no larger and consumes no more power than a conventional combinational logic block. In addition, the apparatus of the present invention produces SEU immune or resistant combinational logic circuits that are smaller and consume less power than conventional SEU immune combinational logic circuits. The present invention can be constructed using commonly available design tools and manufacturing processes. Therefore, the present invention is suitable for a broad range of applications.

DETAILED DESCRIPTION OF THE PREFERRED EMBODIMENT

Figure 1:
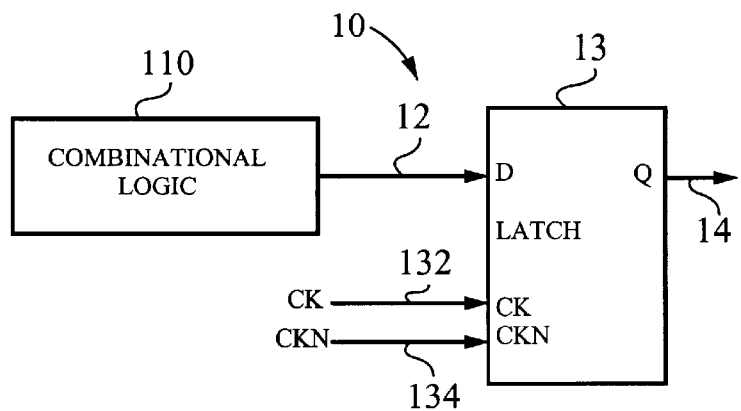
FIG. 1 illustrates a block diagram of a prior art logic circuit.
Figure 2:
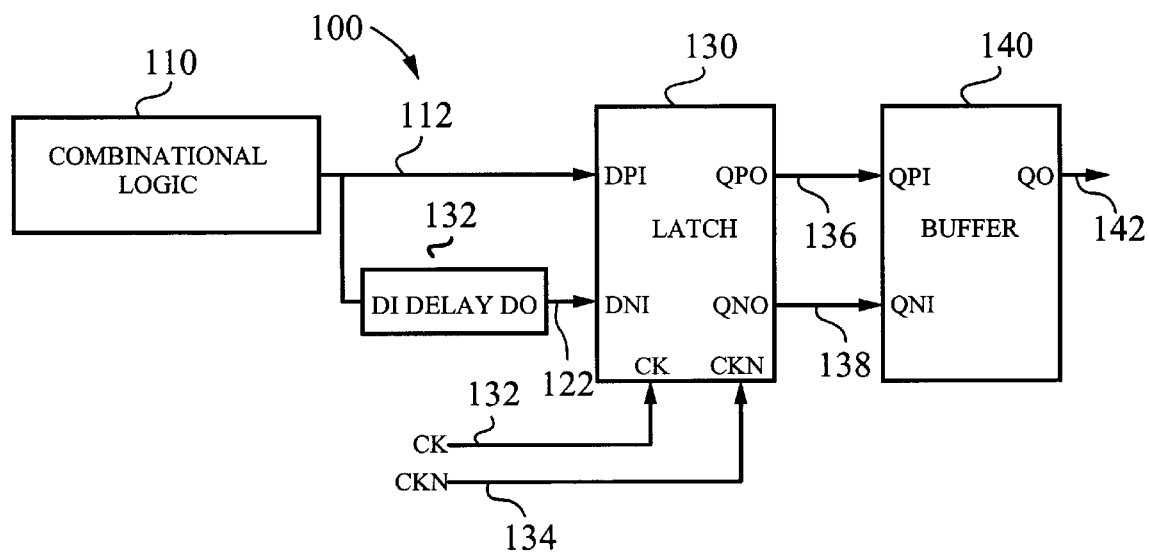
FIG. 2 illustrates a block diagram of a preferred embodiment of a circuit according to the present invention.
Figure 3:
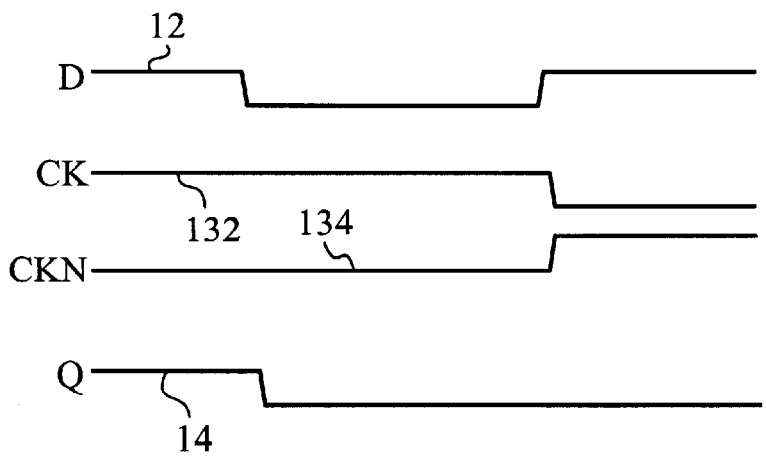
FIG. 3 illustrates a timing diagram of the prior art logic circuit of FIG. 1 without a single event upset.
Figure 4:
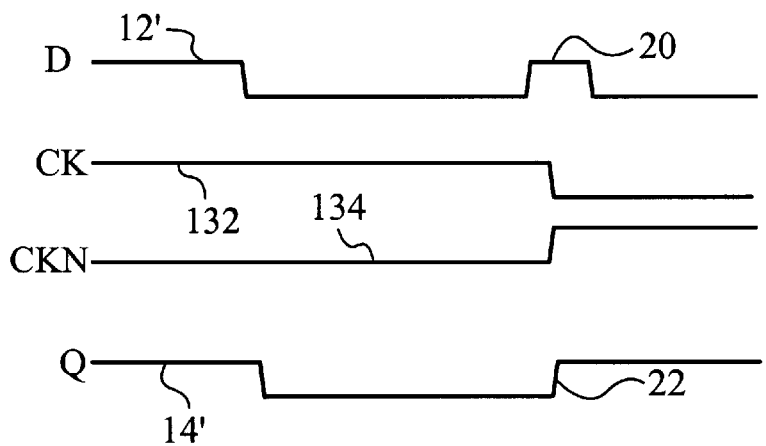
FIG. 4 illustrates a timing diagram of the prior art logic circuit of FIG. 1 during a single event upset.

FIG. 2 illustrates a block diagram of a circuit 100 according to the preferred embodiment of the present invention. Corresponding elements and signals in the preferred embodiment are labeled, where appropriate, with the same reference numbers and letters as the prior art shown in FIGS. 1, 3 and 4. The apparatus of the present invention is preferably embodied in an integrated circuit.

The circuit 100 reduces or eliminates single event upsets caused by cosmic ray strikes and is provided with a combinational logic block 110, a delay element 120, a latch 130, and an output buffer 140. The combinational logic block 110 processes data to produce a result which is provided as a data signal 112. The delay element 120 includes an input terminal DI which is electrically coupled to the combinational logic block 110 and receives the data signal 112. In addition, the delay element 120 includes an output terminal DO which provides a delayed signal 122. Preferably, the delay element 120 is configured to provide the delayed signal 122 which is equal to the data signal 112 delayed by a period of delay time TD. The delay element may be inverting or noninverting depending on the specific embodiment of the invention. Some examples of the various delay element embodiments of the present invention are discussed below and illustrated in FIGS. 7–9.

It can be observed that the latch 130 is more complex in the circuit of the present invention, as illustrated in FIG. 2, than in the prior art logic circuit 10, as illustrated in FIG. 1. The latch 130 of the present invention includes first and second input terminals DPI and DNI, first and second latch output terminals QPO and QNO, a clock terminal CK and an inverted clock terminal CKN. The first input terminal DPI is electrically coupled to the combinational logic block 110 and receives the data signal 112. The second input terminal DNI is electrically coupled to the output terminal DO of the delay element 120 and receives the delayed signal 122.

The latch output terminals QPO and QNO provide latch output signals 136 and 138, respectively. The clock terminals CK and CKN receive a clock signal 132 and an inverted clock signal 134, respectively. Similar to the latch 13 of the prior art logic circuit 10 illustrated in FIG. 1 and described above, the latch 130 of the present invention is designed to only allow changes in the state of the latch output signals 136 and 138 when the clock signals 132 and 134 are asserted. However, the latch 130 used in the present invention is additionally designed to prevent the latch output signals 136 and 138 from changing state unless the signals 112 and 122 at the input terminals DPI and DNI are in a correct state. Preferably, the latch output signals 136 and 138 float when either of the signals 112 and 122 at the latch input terminals DPI and DNI are in an incorrect state.

Figure 6:
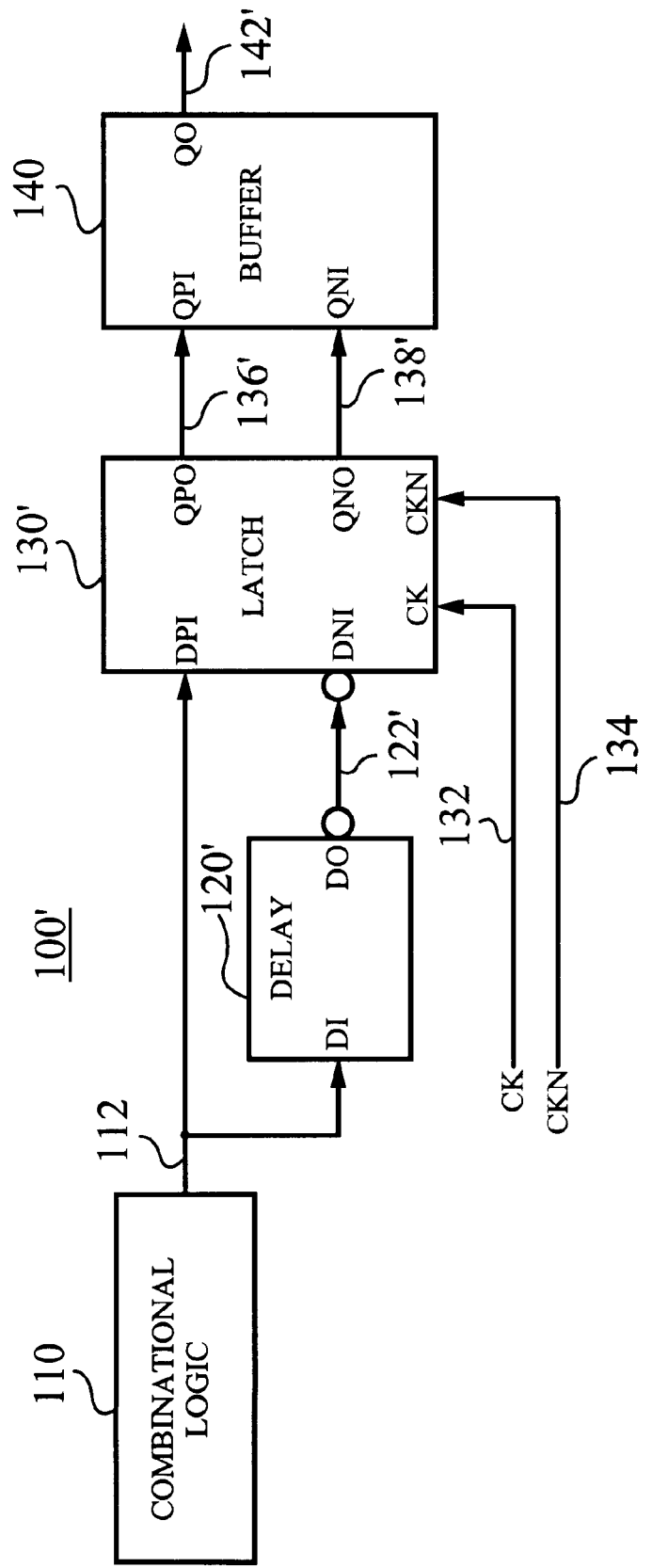
FIG. 6 illustrates a block diagram of an alternate embodiment of a circuit according to the present invention which includes an inverting delay element.

The correct state is defined by the specific embodiment of the circuit of the present invention. For the purpose of illustration, the circuit 100 of the present invention is described herein relative to the latch 130 of FIG. 2 which will only change state when signals provided at the input terminals DPI and DNI have corresponding binary values. In other words, the latch 130 will not pass a value through the latch to its output signals 136 and 138 unless the data signal 112 and the delayed signal 122 are either both logic '1's or both logic '0's. Similarly, the latch 130 is preferably designed to maintain the value or logic state of the latch output signals 136 and 138 when the signals 112 and 122 have opposite logic states. In addition, when the signals 112 and 122 provided at the input terminals DPI and DNI have the same logic state and the clock signals 132 and 134 are asserted, the latch 130 is preferably designed to pass the value of the signals 112 and 122 through the latch 130 to the latch output terminals QPO and QNO. FIG. 6 illustrates an alternate embodiment of the circuit 100' of the present invention which includes a delay element 120' that is inverting and a latch 130' that will only change the value of the output signal 142' when the input signals 112 and 122' have opposite logic states.

The output buffer 140 includes buffer input terminals QPI and QNI and an output terminal QO. The buffer input terminals QPI and QNI are electrically coupled to the output terminals QPO and QNO of the latch 130, and receive the latch output signals 136 and 138, respectively. The output buffer 140 is preferably designed to combine the latch output signals 136 and 138 and prevent a temporary change in state, to a tri-state condition, from being included as an error in the output signal 142. In operation, the output buffer 140 receives and buffers the latch output signals 136 and 138 and produces an output signal 142 which is provided at an output terminal QO of the output buffer 140.

Figure 5:
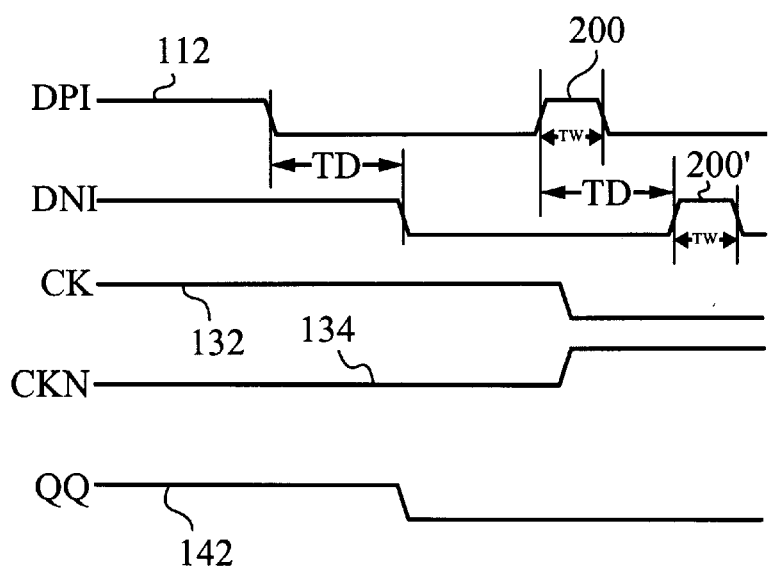
FIG. 5 illustrates a timing diagram of the circuit of the present invention, as illustrated in FIG. 2, including a transient disturbance caused by a cosmic ray strike to the combinational logic circuit.

FIG. 5 illustrates a timing diagram of the circuit 100 of the present invention, as illustrated in FIG. 2. At some time well before the critical transition of the clock signals 132 and 134, the data signal 112 from the combinational logic block 110 falls from a logic '1' level to a logic '0' level. Preferably, the latch 130 should recognize the logic '0' as a valid input state and subsequently store this value. The data signal 112, including the fall from the logic '1' level to the logic '0' level, propagates through the delay element 120 and appears on the delayed signal 122 after a delay time TD. At this time, since both the latch input terminals DPI and DNI inputs are at a logic '0' level, and the clock signals 132 and 134 are asserted, the latch recognizes the '0' as a valid input and the output signal 142 changes to a logic '0'.

FIG. 5 also shows the timing for an exemplary cosmic ray strike in the combinational logic block 110 that causes the transient voltage disturbance 200 in the data signal 112 during the critical transition of the clock signals 132 and 134. The transient disturbance 200 will appear immediately at the first input terminal DPI of the latch 130. The transient disturbance 200 will also pass through the delay element 120 and appear in the delayed signal 122 at the second data input terminal DNI as a delayed transient disturbance 200' after the delay time TD. The delay element 120 is preferably designed such that the delay time TD caused by the delay element 120 is longer than a maximum duration TW of the transient disturbance 200 that will be generated in the data signal 112 as a result of a cosmic particle strike in the combinational logic block 110.

The transient disturbance 200 will appear in the data signal 112 at the first input terminal DPI during the critical transition of the clock signals 132 and 134. However, the delay element prevents the delayed transient disturbance 200' from appearing at the second data input terminal DNI until after the critical transition of the clock signals 132 and 134. However, during the time when the clock signals 132 and 134 are asserted, the first and second input terminals DPI and DNI of the latch 130 do not have the same logic state. Therefore, the latch 130 will not change state and the circuit 100 correctly maintains the logic '0' state of the output signal 142. Furthermore, the transient disturbance 200 will no longer exist in the data signal 112 at the first input terminal DPI by the time the delayed transient disturbance 200' has propagated through the delay element 120 and appears in the delayed signal 122 at the second data input terminal DNI.

As a result, the latch 130 will not store an error due to the delayed transient disturbance 200'. In addition, by the time the delayed transient disturbance 200' reaches the second data input terminal DNI, the critical transition of the clock signals 132 and 134 will have passed, further preventing the output signal 142 from changing state. By delaying the data signal 112, preventing the transient disturbance 200 and the delayed transient disturbance 200' from appearing at the latch input terminals DPI and DNI at the same time and using the latch 130 that will not change state unless both input terminals DPI and DNI have the same state, the circuit 100 of the present invention provides SEU immunity to the combinational logic block 110.

Figure 7:
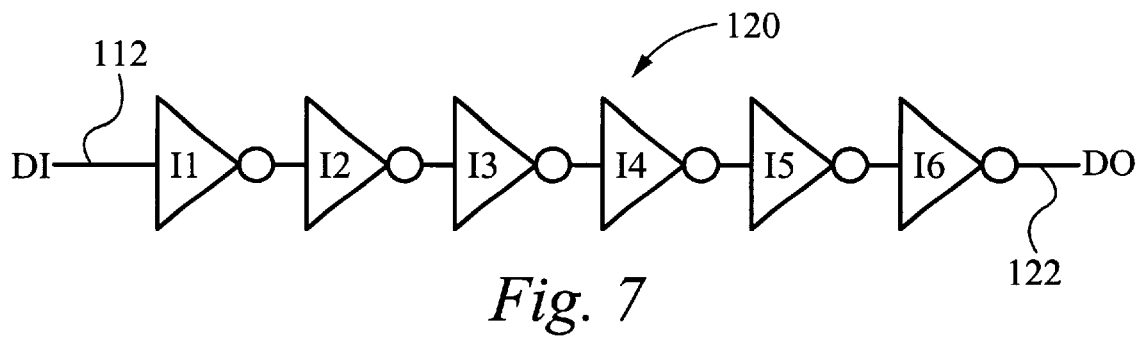
FIG. 7 illustrates a circuit diagram of a non-inverting embodiment of a delay element of the present invention using logic gates.

A circuit diagram of a specific embodiment of the delay element 120 of the present invention is illustrated in FIG. 7. The delay element 120, as illustrated, is preferably noninverting and includes the input terminal DI and the output terminal DO. The input terminal DI receives the data signal 112. Also included in the delay element 120 are inverters I1–I6 which are connected together in a series configuration where each inverter has an input terminal, an output terminal and a delay value. The delay value of each inverter I1–I6 represents the amount of time a signal is delayed when passed through each inverter I1–I6 individually. The input terminal of each inverter I2–I6 is electrically coupled to the output terminal of the previous inverter I1–I5.

The delay time TD of the delay element 120 is equal to the sum of the delay values of each inverter I1–I6. The delay time TD through the delay element 120 may be increased by increasing the number of inverters or designing each inverter such that it has a greater delay value. Similarly, the delay time TD through the delay element 120 may be decreased by decreasing the number of inverters or designing each inverter such that it has a lesser delay value. In order for the delay element 120 to maintain a noninverting function, an even number of inverters are preferably used.

In operation, the input terminal DI of the delay element 120 is electrically coupled to the conventional logic block 110, as illustrated in FIG. 2, and receives the data signal 112. The delay element 120 delays the data signal 112 by the delay time TD to produce the delayed signal 122 which is provided as an output at the output terminal DO of the delays element 120. Furthermore, when used in the circuit of the present invention, as illustrated in FIG. 2, the output terminal DO of the delay element 120 is electrically connected to the second input terminal DNI of the latch 130.

Figure 8:
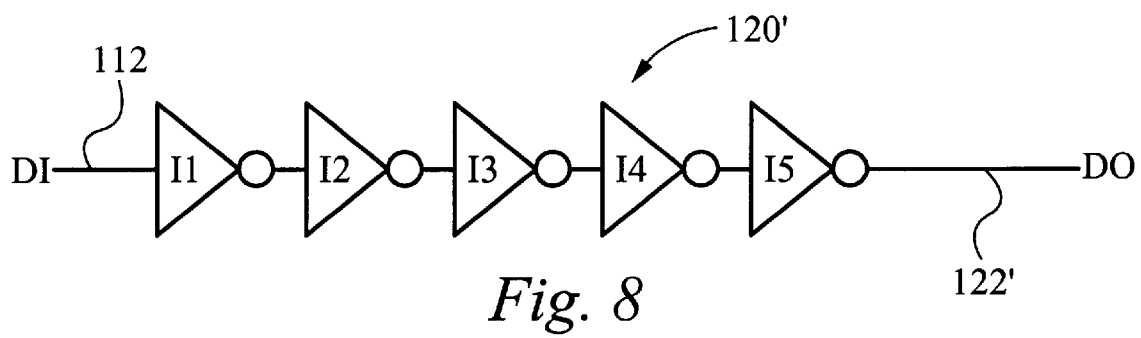
FIG. 8 illustrates a circuit diagram of an inverting embodiment of the delay element of the present invention using logic gates.

Similarly, FIG. 8 illustrates an inverting embodiment of the delay element 120' using logic gates. To provide an inverting function to the delay element 120', where the delayed signal 122' equals a time delayed complement of the data signal 112, an odd number of inverters are preferably used. The inverting delay element 120' includes inverters I1–I5 connected to each other in a series configuration. Again, the time delay TD' through the delay element 120' is equal to the sum of the delay value for each inverter I1–I5. In operation, the input terminal DI of the delay element 120' is electrically coupled to the conventional logic block 110, as illustrated in FIG. 6, and receives the data signal 112. The delay element 120' delays and inverts the data signal 112 by the delay time TD' to produce the delayed signal 122' which is provided as an output at the output terminal DO of the delay element 120'. Furthermore, when used in the circuit of the present invention, as illustrated in FIG. 6, the output terminal DO of the delay element 120' is electrically connected to the second input terminal DNI of the latch 130'.

Figure 9:
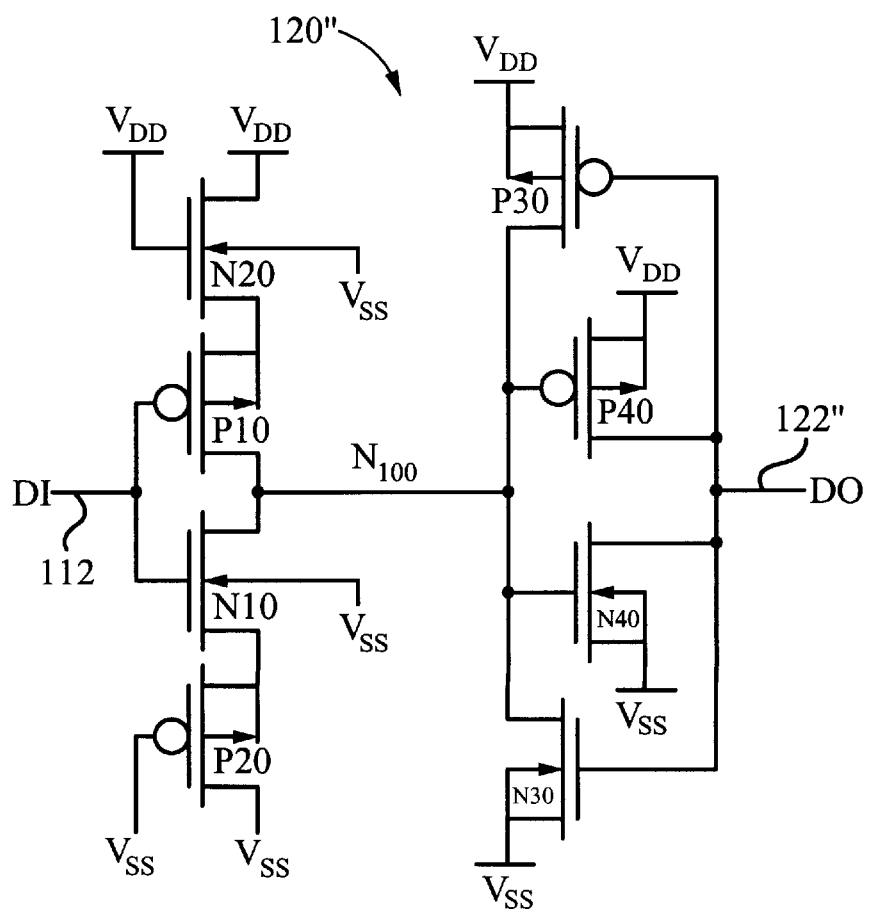
FIG. 9 illustrates a circuit diagram of a preferred embodiment of the delay element of the present invention using a non-inverting feedback controlled delay element.

A circuit diagram for a preferred embodiment of the delay element 120" is illustrated in FIG. 9. The alternate delay element 120" is non-inverting and designed to use feedback to control the delay time TD" applied to the data signal 112 from the combinational logic block 110 to produce the delayed signal 122". A CMOS process with N-type wells on a P-type substrate is employed in the alternate delay element 120" for the purposes of illustration. However, essentially equivalent embodiments can be created using P-well or twin-well processes without departing from the spirit and scope of the present invention. Similar to the delay element illustrated in FIG. 7, the alternate delay element 120" includes the input terminal DI and the output terminal DO. When the alternate delay element 120" is incorporated into a circuit 100 of the present invention, as illustrated in FIG. 2, the input terminal DI is electrically connected to the combinational logic block 110 and receives the data signal 112. Furthermore, the output terminal DO is electrically connected to the second input terminal DNI of the latch 130.

As illustrated in FIG. 9, the alternate delay element 120" includes four NMOS or N-channel transistors and four PMOS or P-channel transistors. An NMOS transistor N10 and a PMOS transistor P10 are coupled to the input terminal DI and receive the data signal 112 at the gates of the transistors P10 and N10. The drain of the transistor P10 and the drain of the transistor N10 are coupled together and to a node N100. The transistors P10 and N10 form an inverter that drives the node N100 with an inverted or complement value of the data signal 112. The source of an N-channel transistor N20 is coupled to the source of the transistor P10.

The gate and the drain of the transistor N20 are coupled to a positive supply voltage $V_{DD}$. The body terminals of the transistors N10 and N20 are coupled to a ground supply voltage $V_{SS}$. The source of the transistor N10 is coupled to the source of a P-channel transistor P20. The gate and the drain of the transistor P20 are coupled together and to the ground supply voltage $V_{SS}$.

The gates of a P-channel transistor P40 and an N-channel transistor N40 are coupled to the node N100. The drain of the transistor P40 and the drain of the transistor N40 are coupled to the output terminal DO and provide the delayed signal 122". The drain of a P-channel transistor P30 is coupled to the node N100. The body terminals and the source terminals of each of the transistors P30 and P40 are coupled together and to the positive supply voltage $V_{DD}$. The drain of a N-channel transistor N30 is coupled to the node N100. The body terminal and the source terminal of each of the transistors N30 and N40 are coupled together and to the ground supply voltage $V_{SS}$.

For each of the transistors P10 and P20, the body terminal and the source terminal are coupled together. As a result of their source terminals being coupled to their body terminals, each of the transistors P10 and P20 has no increased threshold voltage even though their source terminals are supplied by voltages that are lower than the positive supply voltage $V_{DD}$. More specifically, each of the transistors P10 and P20 preferably has no body effect and, therefore, no increase in threshold voltage. The transistor N20 serves to lower an effective value of the positive supply voltage for the inverter formed by the transistors P10 and N10 by the threshold voltage of the transistor N20. Similarly, the transistor P20 serves to raise an effective value of the ground supply voltage for the inverter formed by the transistors P10 and N10 by the threshold voltage of the transistor P20. Thus, the inverter formed by the transistors P10 and N10 is supplied by a voltage equal to the effective value of the positive supply voltage less the effective value of the ground supply voltage. As a result of this significantly reduced supply voltage, the inverter formed by the transistors P10 and N10 is weak and requires an increased amount of time to produce the complement of the data signal 112 at the node N100.

In addition, the transistors P40 and N40 form an inverter that acts as an output buffer. The gates of the transistors N30 and P30 are coupled to the output buffer formed by the transistors P40 and N40 and are driven by the delayed signal 122". As a result, the transistors P30 and N30 supply feedback to the node N100 to increase a delay time of the alternate delay element 120".

For example, consider the case when the data signal 112 at the input terminal DI of the alternate delay element 120" is at a logic '0' and has been for a relatively long period of time. The transistors P10, P20, P30, N20, and N40 are on or enabled. The transistors P40, N10 and N30 are off or disabled. The inverter formed by the transistors P10 and N10 will drive the node N100 to a logic '1' and the output buffer formed by the transistors P40 and N40 will drive the output terminal DO to a logic '0'. Specifically, when the output terminal DO is in a logic '0' state, the transistor P30 is enabled and supplies positive feedback current to the node N100. The feedback current will reinforce the logic '1' driven by the inverter formed by the transistors P10 and N10 and bring the node N100 completely high to the positive supply voltage $V_{DD}$.

If the data signal 112 at the input terminal DI should now change to a logic '1', then the inverter formed by the transistors P10 and N10 will attempt to discharge the node N100. However, until the node N100 falls below a switching threshold of the output buffer formed by the transistors P40 and N40, the delayed signal 122" at the output terminal DO will remain at a logic '0'. In addition, the transistor P30 will continue to supply a positive current to hold the node N100 at a logic '1'.

The delay time of the alternate delay element 120" is controlled by the time necessary for the node N100 to fall below the switching threshold of the transistors P40 and N40. Therefore, the difference between a discharge current flowing through the transistors N10 and P20 and a charging current flowing through the transistor P30 determines the delay time of the alternate delay element 120". The relative sizes of the transistors P20, N10, and P30 are preferably designed and selected such that the difference in these currents is small although the discharge current is slightly greater than the charging current, and the resulting time required to discharge the node N100, and the delay time of the alternate delay element 120", will be quite long.

Once the node N100 has been discharged below the switching threshold of the output buffer formed by the transistors P40 and N40, the delayed signal 122" at the output terminal DO will switch from a logic '0' to a logic '1'. At this time the transistor P30 will be disabled and the transistor N30 will be enabled, greatly increasing the net current that is discharging the node N100 and bringing the voltage on this node completely to ground or a logic '0' state. A similar series of events takes place if the data signal 112 at the input terminal DI is initially in the logic '1' state and then changes to a logic '0'.

After examining FIG. 9 and reviewing the above description of the structure of the alternate embodiment of the delay element 120" of the present invention, one of ordinary skill in the art will find it obvious to employ a feedback controlled inverting delay element in the circuit 100' (FIG. 6) of the present invention. The structure and operation of the feedback controlled inverting delay element are similar to the operation and structure of the feedback controlled delay element 120" shown in FIG. 9 and described above. Specifically, feedback is used to control a delay time. In the case of the feedback controlled inverting delay element, however, the delay time is applied to the complement value of the data signal 112 from the combinational logic block 110 similar to the operation of the inverting delay element 120' of FIG. 8. As a result, the feedback controlled delay element produces an output signal that is both inverted and delayed. In addition, the feedback controlled inverting delay element is electrically connected to the circuit 100' shown in FIG. 6 in a manner similar to the electrical connection discussed above for the delay element 120' shown in FIG. 8.

Figure 10:
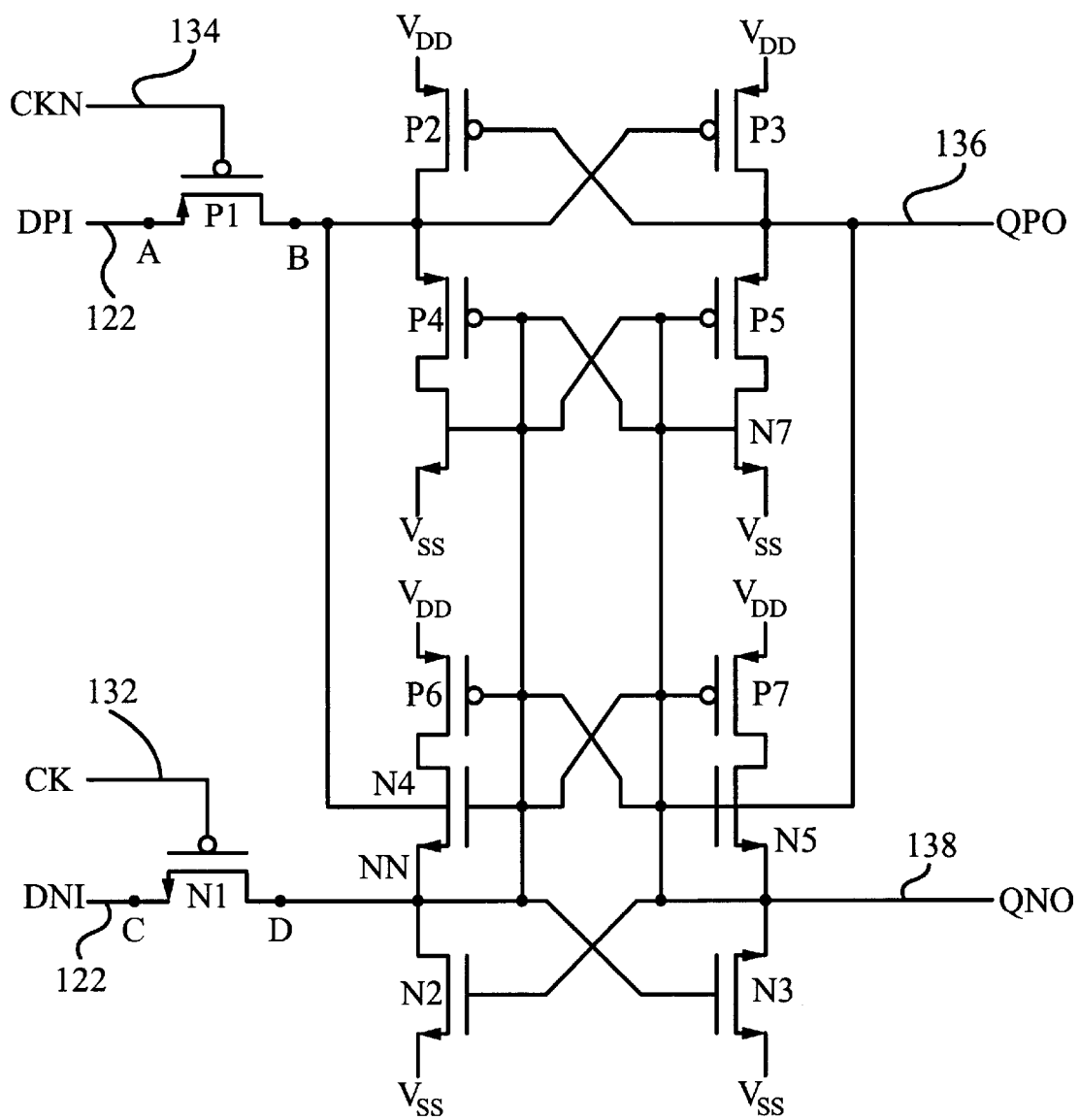
FIG. 10 illustrates a circuit diagram of an embodiment of a latch used in the present invention.

FIG. 10 shows a schematic diagram for an embodiment of a latch circuit used in the present invention. The latch 130 implementation preferably requires that both latch input terminals DPI and DNI be in the same state when the clock terminals CK and CKN are asserted in order for the latch 130 to assume a new internal state. The latch 130 includes seven N-channel devices and seven P-channel devices. A P-channel transistor P1 is configured as an input pass transistor for coupling the data signal 112 to the latch 130 under the control of the inverted clock signal 134. The transistor P1 is preferably a bi-directional switch including a first terminal A and a second terminal B and a gate. More preferably, the transistor P1 is configured such that the first terminal A of the transistor P1 is either a source or a drain, depending on a value of the data signal 112. When the first terminal A of the transistor P1 is the source, the second terminal B of the transistor P1 is the drain. Likewise, when the first terminal A of the transistor P1 is the drain, the second terminal B is the source.

The first terminal A of the P-channel transistor P1 is coupled to the first latch input terminal DPI to receive the data signal 112. The gate of the P-channel transistor P1 is coupled to the inverted clock terminal CKN and receives the inverted clock signal 134. The second terminal B of the transistor P1 is coupled to an internal node PP, to the drain of a P-channel transistor P2, the gate of a P-channel transistor P3, to the source of a P-channel transistor P4, and to control the gates of an N-channel transistor N4 and a P-channel transistor P7.

The drain of the P-channel transistor P3 is coupled to the first latch output terminal QPO. The drain of the transistor P3 is also coupled to control the gate of the transistor P2, to the source of a P-channel transistor P5 and to control the gates of an N-channel transistor N5 and a P-channel transistor P6. The sources of the transistors P2 and P3 are coupled to the positive supply voltage $V_{DD}$. The transistors P2 and P3 are cross-coupled for storing the first latch output signal 136 at the first latch output terminal QPO.

The drain of the transistor N4 is coupled to the drain of the transistor P6. The source of the transistor P6 is coupled to the positive supply voltage $V_{DD}$. The drain of the transistor N5 is coupled to the drain of the transistor P7. The source of the transistor P7 is coupled to the positive supply voltage $V_{DD}$. The drain of the transistor P4 is coupled to the drain of a transistor N6. The source of the transistor N6 is coupled to the ground supply voltage $V_{SS}$. The drain of the transistor P5 is coupled to the drain of a transistor N7. The source of the transistor N7 is coupled to the ground supply voltage $V_{SS}$.

An N-channel transistor N1 is configured as an input pass transistor for coupling the delayed signal 122 to the latch 130 under the control of the clock signal 132. Similar to the input pass transistor P1, the transistor N1 is also preferably a bi-directional switch including a first terminal C and a second terminal D and a gate. More preferably, the transistor N1 is configured such that the first terminal C of the transistor N1 is either a source or a drain, depending on a value of the delayed signal 122. When the first terminal C of the transistor N1 is the source, the second terminal D of the transistor N1 is the drain. Likewise, when the first terminal C of the transistor N1 is the drain, the second terminal D is the source.

The first terminal C of the pass transistor N1 is coupled to the second latch input terminal DNI to receive the delayed signal 122 and the gate of the pass transistor N1 is coupled to the clock terminal CK to receive the clock signal 132. The second terminal D of the pass transistor N1 is coupled to an internal node NN, to the drain of an N-channel transistor N2, the source of the N-channel transistor N4 and to control the gates of an N-channel transistor N3, the N-channel transistor N7 and the P-channel transistor P4. The drain of the transistor N3 is coupled to the second latch output terminal QNO.

The drain of the transistor N3 is also coupled to the gate of the transistor N2, to the source of the transistor N5 and to control the gates of the transistor N6 and the transistor P5. The sources of the transistors N2 and N3 are coupled to the ground supply voltage $V_{ss}$. The transistors N2 and N3 are cross-coupled for storing the second latch output signal 138 at the second latch output terminal QNO.

Figure 11:
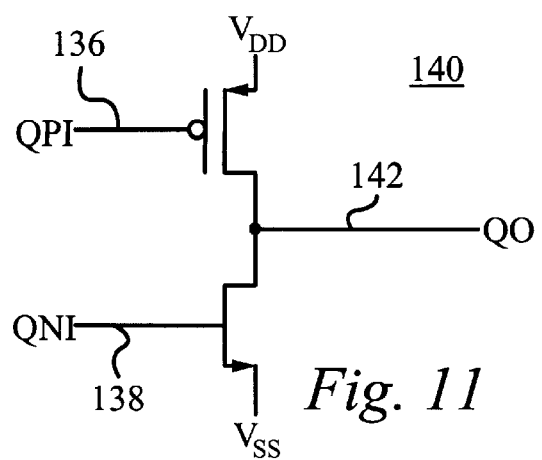
FIG. 11 illustrates a circuit diagram of an embodiment of an output buffer used in the present invention.

FIG. 11 shows a schematic diagram for a specific implementation on the output buffer 140. The latch 130 and the output buffer 140 are connected together as described above and shown in FIG. 2. The output buffer 140 includes a P-channel device and an N-channel device. The gate of a P-channel transistor P8 is coupled to the first buffer input terminal QPI and receives the first latch output signal 136. The source of the transistor P8 is coupled to the positive supply voltage $V_{DD}$. The drain of the transistor P8 is coupled to the output terminal QO and to the drain of an N-channel transistor N8. The source of the transistor N8 is coupled to the ground supply voltage $V_{SS}$. The gate of the transistor N8 is coupled to the second buffer input terminal QNI and receives the second latch output signal 138.

Preferably, the input pass transistor P1 is stronger than the other transistors P2, P4 and N6 driving the internal node PP. In addition, the input pass transistor N1 is preferably stronger than the other transistors N2, N4 and P6 driving the internal node NN. The result is that the data signal 112 will be forced on to the internal node PP and the delayed signal 122 will be forced onto the internal node NN when the clock signals 132 and 134 are asserted. The embodiment of the present invention which includes the latch 130 illustrated in FIG. 10, is preferably designed such that the transistor P3 is stronger than the transistors P5 and N7, and the transistor N3 is stronger than the transistors N5 and P7. As a result, when the transistors P3, P5 and N7 are all enabled at the same time, the first latch output signal 136 will be high enough to disable the transistor P8 in the output buffer 140. Similarly, when the transistors N3, N5 and P7 are all enabled at the same time, the second latch output signal will be low enough to disable the transistor N8 in the output buffer 140.

As an example of the operation of the latch 130 of FIG. 10 and the output buffer 140 of FIG. 11, consider the case where the data signal 112 is at a steady state for a period of time well before the clock signal transition. Assume that both the data signal 112 at the first latch input terminal DPI and the delayed signal 122 at the second latch input terminal DNI are at a logic '0' state, for example, and the clock signal 132 at the clock terminal CK is asserted to a '1' and the inverted clock signal 134 at the inverted clock terminal CKN is asserted to a '0'. In this steady state before the transient disturbance 200 arrives at the first input terminal DPI of the latch 130, the transistors P1, P3, P4, P7, N1, N2, N5 and N6 are on or enabled. Also, the transistors P2, P5, P6, N3, N4, and N7 are off or disabled. Both latch output signals 136 and 138 at the latch output terminals QPO and QNO and the buffer input terminals QPI and QNI, respectively, are at a logic '1'. Accordingly in the output buffer 140, the transistor N8 is enabled and the transistor P8 is disabled. As a result, the output signal 142 at the output terminal QO is a logic '0'.

More specifically, both input pass transistors P1 and N1 are enabled, so the internal nodes PP and NN are also at a logic '0'. The logic '0' at the internal node PP enables the transistor P3 to bring the first latch output signal 136 at the first latch output terminal QPO to a logic '1'. The logic '0' on the internal node PP and the logic '1' on the first latch output terminal QPO enables the transistors P7 and N5 to bring the second latch output terminal QNO to a logic '1'. Since the first latch output signal 136 at the first latch terminal QPO is a logic '1', the transistor P8 in the output buffer 140 is disabled. The transistor N8 in the output buffer 140 is enabled because the second latch output signal 138 is a logic '1', thus forcing the output signal 142 on the output terminal QO to a logic '0'. This is the stable state of the latch 130 when it is storing a logic '0'.

Considering the case when the latch 130 is in this stable state and a cosmic particle strikes the combinational logic block 110 that creates the data signal 112 while the clock signals 132 and 134 are still asserted. During the cosmic particle strike the transient disturbance 200 is produced in the data signal 112 at the first latch input terminal DPI. The data signal 112 temporarily changes state from a logic '0' to a logic '1'. The internal node PP will also change to a logic '1' and the transistor P3 will be disabled. However, the first latch output terminal QPO will preferably remain at a logic '1' state due to parasitic capacitances of the transistors P3 and P5 coupled to the first latch output terminal QPO. Similarly, the logic '1' on the internal node PP will disable the transistors P7. The second latch output terminal QNO will preferably remain at a logic '1' due to parasitic capacitances of the transistors N3 and N5 coupled to the second latch output terminal QNO. The transistor N2 remains enabled and the transistor P6 remains disabled, so the state of the internal node NN remains unchanged. With the internal node NN at a logic '0' and the second latch output terminal QNO at a logic '1', the transistors P4 and N6 are enabled and attempt to restore the correct logic '0' state to the internal node PP. However, as indicated above, the transistor P1 is preferably designed to be stronger than the transistors P4 and N6. Therefore, the transistors P4 and N6 will not be able to pull the internal node PP to the correct logic state while the transistor P1 is enabled.

If the clock signals 132 and 134 at the clock terminals CK and CKN happen to be deasserted while the data signal 112 at the first latch input terminal DPI is still in the erroneous logic '1' state, then the transistor P1 will be disabled and the transistors P4 and N6 will restore the correct logic '0' state to the internal node PP. With the internal node PP at a logic '0', the transistor P3 is enabled and holds the first latch output signal 136 at the first latch output terminal QPO in the stable logic '1' state.

If the clock signals 132 and 134 are still asserted after a period of time greater than the maximum duration TW of the transient disturbance 200 then the data signal 112 at the first latch input terminal DPI will return to the correct logic '0' state. As a result, the internal nodes PP and NN will return to the stable logic '0' state and the latch output signals 136 and 138 will return to the stable logic '1' state. Since the latch output terminals QPO and QNO remain at a logic '1' state for the duration of this event, the output signal 142 at the output terminal QO remains at the correct logic '0' state. Therefore, the circuit 100 of the present invention has shown immunity to SEU from the transient disturbance 200 in the data signal 112.

Furthermore, after the transient disturbance 200, the data signal 112 will preferably return to the stable logic '0' state before the delayed transient disturbance 200' appears in the delayed signal 122 at the second latch input terminal DNI. After the delay time TD, the data signal 112 at the first latch data input terminal will be a logic '0' and the delayed signal 122 at the second latch input terminal DNI will temporarily rises to a logic '1' state. Assuming the clock signals 132 and 134 are still asserted, the internal node NN will also change to a logic '1', causing the transistor N3 to be enabled. As previously indicated, the transistor N3 is preferably stronger than the transistors N5 and P7, and the transistor P3 is preferably stronger than the transistors P5 and N7. Therefore, when the transistor N3 is enabled, the second latch output terminal QNO will be brought to a logic '0', regardless of the state of the internal node PP and the first latch output terminal QPO. With the internal node NN at a logic '1' and the second latch output terminal QNO at a logic '0', the transistors P4 and N6 are disabled but the internal node PP will remain at the logic '0' state. The transistors P5 and N7 are now enabled and will attempt to bring the first latch output terminal QPO to a logic '0'. When the logic '0' state of the second latch output signal 138 from the second latch output terminal QNO reaches the second input terminal QNI of the output buffer 140, the transistor N8 will be disabled. If the transistor P8 of the output buffer 140 remains disabled then the output signal 142 at the output terminal QO will maintain the correct logic '0' state due to the parasitic capacitance associated with the output terminal QO. Since the latch 130 and the output buffer 140 are preferably designed such that the transistor P3 is stronger than the transistors P5 and N7, the first latch output signal 136 is sufficiently high to disable the transistor P8 of the output buffer 140 when the transistors P3, P5 and N7 are simultaneously enabled, As a result, the output signal 142 at the output terminal QO will maintain the correct logic '0'.

Similar to the transient disturbance 200 in the data signal 112, if the delayed transient disturbance 200' ends and the delayed signal 122 returns to the correct logic '0' state while the clock signals 132 and 134 are still asserted, then the latch 130 will return to the stable, correct logic '0' state. If the clock signals 132 and 134 at the clock terminals CK and CKN are deasserted while the delayed signal 122 at the second latch input terminal DNI is still in the incorrect logic '1' state, then the latch 130 is left in a metastable internal state, with the first latch output signal 136 on the first latch output terminal QPO maintaining a logic '1' and the second latch output signal 138 on the second latch output terminal QNO maintaining a logic '0'. The apparatus of the present invention is preferably designed such that the latch 130 and the output buffer 140 can remain in this state for a relatively long period of time without the output signal 142 at the output terminal QO assuming an incorrect logic state. The metastable internal state will be eliminated when the clock signals 132 and 134 are next asserted. Therefore, the circuit 100 of the present invention has also shown immunity to SEU from the delayed transient disturbance 200' in the delayed signal 122.

The upper and lower halves of the latch 130 and the output buffer 140 are symmetrical. Therefore, the same analysis applies to the case where the data signal 112 from the combinational logic block is initially at a stable logic '1' state. The present invention provides SEU immunity to the circuit 100 when a cosmic particle strike causes the data signal 112 to change to a logic '0' state. In each case, the delay element 120, the latch 130 and the output buffer 140 of the circuit 100 of the present invention prevent a cosmic particle strike in the combinational logic block 110 from causing an error to appear in the output signal 142 at the output terminal QO.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the preferred embodiment chosen for illustration without departing from the spirit and scope of the invention.

Specifically, it will be apparent to one of ordinary skill in the art that the present invention, an apparatus for eliminating single event upsets in combinational logic, could be implemented in several different ways. For example, the preferred embodiment of FIG. 2 illustrates the circuit of the present invention including a combinational logic block 110. One of ordinary skill in the art will find it apparent to use the circuit of the present invention without an internal combinational logic block by attaching the apparatus of the present invention to an external combinational logic block.

Similarly, the preferred embodiment of the present invention is an integrated circuit. However, the circuit of the present invention could be constructed using discrete components without departing from the spirit of the invention. In addition, the method of the present invention includes a step of delaying the data signal 112 to produce the delayed signal 122. Delay elements 120 and 120', using logic gates, and alternate delay elements 120", using feedback control, have been described for the purpose of illustration. One of ordinary skill in the art will find it apparent to delay the data signal in a number of different ways.

What is claimed is:

1. A method of eliminating single event upsets in a combinational logic block comprising the steps of:
    a. delaying a combinational logic block signal thereby providing a delayed signal;
    b. comparing the combinational logic block signal and the delayed signal to determine if a predetermined condition is met;
    c. providing as an output signal a selective one of the combinational logic block signal and the delayed signal during a period when the predetermined condition is met; and
    d. preventing the output signal from changing during all periods except the period when the predetermined condition is met.

2. The method as claimed in claim 1 wherein the predetermined condition is met when the combinational logic block signal and the delayed signal have corresponding binary states.

3. The method as claimed in claim 1 wherein the step of delaying the combinational logic block signal further comprises the step of inverting the combinational logic block signal, and wherein the predetermined condition is met when the combinational logic block signal and the delayed signal have complementary binary states.

4. The method as claimed in claim 1 wherein the step of delaying the combinational logic block signal further comprises the step of preventing a transient disturbance from appearing in the combinational logic block signal and the delayed signal simultaneously.

5. The method as claimed in claim 1 wherein the step of preventing the output signal from changing comprises the step of buffering the output signal.

6. An apparatus for reducing or eliminating single event upsets that result from transient disturbances caused by cosmic particle strikes to a combinational logic block, the apparatus comprising:
    a. a node configured for receiving a combinational logic block signal from the combinational logic block;
    b. a delay element configured for receiving the combinational logic block signal and providing a delayed signal, wherein the delay element includes a delay input terminal electrically coupled to the node and a delay output terminal and wherein the delayed signal includes the combinational logic block signal and a time delay;
    c. a latch having a first latch input terminal electrically coupled to the node and configured for receiving the combinational logic block signal, a second latch input terminal electrically coupled to the delay output terminal and configured for receiving the delayed signal, and at least one latch output terminal configured for providing a latch signal, wherein the latch is configured for selectively providing one of the combinational logic block signal and the delayed signal as the latch signal when the combinational logic signal and the delayed signal meet a predetermined condition; and
    d. a buffer having a plurality of buffer input terminals wherein at least one of the buffer input terminals is electrically coupled to the latch output terminal and configured for receiving the latch signal, and at least one buffer output terminal configured for providing an output signal wherein the buffer is configured for providing the latch signal as the output signal when the predetermined condition is met and for maintaining the output signal unchanged when the predetermined condition is not met.

7. The apparatus as claimed in claim 6 wherein the delay element comprises a plurality of logic gates electrically coupled together in a series configuration to provide the time delay of a predetermined length.

8. The apparatus as claimed in claim 7 wherein the predetermined length of the time delay is greater than a maximum length of the transient disturbance resulting from the cosmic particle strikes to the combinational logic block.

9. The apparatus as claimed in claim 6 wherein the delay element includes a feedback controlled logic circuit configured for providing the delayed signal using feedback from the delayed signal to an internal node to provide the time delay of a predetermined length.

10. The apparatus as claimed in claim 9 wherein the feedback controlled logic circuit is further configured for using a reduced effective supply voltage to provide the time delay.

11. The apparatus, as claimed in claim 10 wherein the predetermined length of the time delay is greater than a maximum length of the transient disturbance resulting from cosmic particle strikes to the combinational logic block.

12. The apparatus, as claimed in claim 6 wherein the delay element is configured for using a reduced effective supply voltage to provide the time delay of a predetermined length.

13. The apparatus as claimed in claim 6 wherein the predetermined condition is met when the combinational logic block signal and the delayed signal have corresponding binary states.

14. The apparatus as claimed in claim 6 wherein the delay element is further configured for inverting the combinational logic block signal and wherein the predetermined condition is met when the combinational logic signal and the delayed signal have complementary binary states.

15. A device for preventing a single event upset occurrence from affecting an output signal of the device comprising:
    a. a combinational logic block configured for processing data thereby forming a result;
    b. a delay element electrically coupled to the combinational logic block and configured for time delaying the result to produce a delayed result;
    c. a latch electrically coupled to the combinational logic block and the delay element and configured for comparing the result and the delayed result and providing a selective one of the result and the delayed result as the output signal when the result and the delayed result meet a predetermined condition; and
    d. a buffer element electrically coupled to the latch and configured for buffering the output signal and preventing the output signal from changing when then the predetermined condition is not met.

16. The device, as claimed in claim 15 wherein the predetermined condition is met when the result and the delayed result have corresponding binary states.

17. The device as claimed in claim 15 wherein the predetermined condition is met when the result and the delayed result have complementary binary states and the delay element further comprises an inverter.

18. The device as claimed in claim 15 wherein the delay element comprises a plurality of logic gates electrically coupled together in a series configuration to provide a time delay of a predetermined length.

19. The device as claimed in claim 18 wherein the predetermined length of the time delay is greater than a maximum length of a transient disturbance resulting from cosmic particle strikes to the combinational logic block.

20. The device as claimed in claim 15 wherein the delay element comprises a feedback controlled logic circuit configured for providing the delayed result using feedback from the delayed result to an internal node to provide a time delay of a predetermined length.

21. The device as claimed in claim 20 wherein the feedback controlled logic circuit is further configured for providing the delayed result using a reduced effective supply voltage to provide the time delay.

22. The device as claimed in claim 21 wherein the predetermined length of the time delay is greater than a maximum length of a transient disturbance resulting from cosmic particle strikes to the combinational logic block.

23. The device as claimed in claim 15 wherein the delay element is configured for providing the delayed result using a reduced effective supply voltage to provide a time delay of a predetermined length.

24. The device as claimed in claim 23 wherein the predetermined length of the time delay is greater than a maximum length of a transient disturbance resulting from cosmic particle strikes to the combinational logic block.

25. A combinational logic integrated circuit having improved immunity to a single event upset, the integrated circuit comprising:

a. an input pin configured for receiving an input signal;
   b. a combinational logic block electrically coupled to the input pin and configured for processing the input signal to provide a result;
   c. a delay element electrically coupled to the combinational logic block and configured for time delaying the result to produce a delayed result;
   d. a latch electrically coupled to the combinational logic block and the delay element and configured for comparing the result and the delayed result and providing a selective one of the result and the delayed result as an output signal when the result and the delayed result meet a predetermined condition and maintaining the output signal when the result and the delayed result do not meet the predetermined condition;
   e. a buffer element electrically coupled to the latch and configured for buffering the output signal to maintain the output signal when the predetermined condition is not met and preventing a transient disturbance from appearing in the output signal; and
   f. an output pin electrically coupled to the buffer element and configured for providing the output signal.

26. The integrated circuit as claimed in claim 25 wherein the predetermined condition is met when the result and the delayed result have complementary binary states and the delay element further comprises an inverter.

27. The integrated circuit as claimed in claim 25 wherein the predetermined condition is met when the result and the delayed result have corresponding binary states.

28. The integrated circuit as claimed in claim 25 wherein the delay element comprises a plurality of logic gates electrically coupled together in a series configuration to provide a time delay of a predetermined length.

29. The integrated circuit as claimed in claim 28 wherein the predetermined length of the time delay is greater than a maximum length of a transient disturbance resulting from cosmic particle strikes to the combinational logic block.

30. The integrated circuit as claimed in claim 25 wherein the delay element comprises a feedback controlled delay logic circuit configured for propagating the delay signal using feedback from the delayed signal to an internal node and a reduced effective supply voltage to provide a time delay of a predetermined length.

31. The integrated circuit as claimed in claim 30 wherein the predetermined length of the time delay is greater than a maximum length of a transient disturbance resulting from cosmic particle strikes to the combinational logic block.

\* \* \* \* \*